(12) United States Patent
McIntyre et al.

(10) Patent No.: US 8,041,518 B2
(45) Date of Patent: Oct. 18, 2011

(54) DETERMINING DIE TEST PROTOCOLS BASED ON PROCESS HEALTH

(75) Inventors: Michael G. McIntyre, Austin, TX (US); Kevin R. Lensing, Austin, TX (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 11/745,688

(22) Filed: May 8, 2007

(65) Prior Publication Data
US 2008/0281545 A1      Nov. 13, 2008

(51) Int. Cl.
*G01R 15/00*        (2006.01)
(52) U.S. Cl. ............ 702/57; 702/117; 702/118; 702/182
(58) Field of Classification Search .............. 702/57–59, 702/35, 36, 81–84, 117, 118, 127, 179, 182, 702/183, 185, 187; 438/14, 16, 122; 700/108
See application file for complete search history.

(56) References Cited

U.S. PATENT DOCUMENTS

| | | | |
|---|---|---|---|
| 5,519,193 A * | 5/1996 | Freiermuth et al. .......... 219/678 |
| 6,265,232 B1 * | 7/2001 | Simmons ...................... 438/14 |
| 6,338,001 B1 * | 1/2002 | Steffan et al. ................. 700/121 |
| 6,414,508 B1 * | 7/2002 | London ........................ 324/765 |
| 6,844,747 B2 * | 1/2005 | Abadeer et al. .............. 324/750 |
| 6,928,628 B2 | 8/2005 | Seligson et al. .................. 716/4 |
| 6,943,042 B2 | 9/2005 | Madge et al. .................. 438/14 |
| 6,959,224 B2 | 10/2005 | Good et al. ..................... 700/97 |
| 6,978,187 B1 * | 12/2005 | Ryskoski ....................... 700/100 |
| 7,197,469 B2 | 3/2007 | Hegde et al. ...................... 705/8 |
| 7,198,964 B1 | 4/2007 | Cherry et al. .................... 438/14 |
| 7,248,939 B1 | 7/2007 | Chamness et al. ............ 700/121 |
| 7,415,386 B2 | 8/2008 | Burch et al. .................... 702/183 |
| 2002/0095278 A1 * | 7/2002 | Riley et al. ........................ 703/2 |
| 2002/0121915 A1 | 9/2002 | Monfull et al. ............... 324/765 |
| 2002/0135389 A1 * | 9/2002 | Melgaard et al. .............. 324/760 |
| 2002/0161532 A1 * | 10/2002 | Dor et al. .......................... 702/35 |
| 2004/0040003 A1 * | 2/2004 | Seligson et al. .................. 716/4 |
| 2005/0085932 A1 | 4/2005 | Aghabadazadeh et al. ... 700/108 |
| 2005/0125090 A1 | 6/2005 | Sakano et al. ................ 700/108 |
| 2006/0009872 A1 | 1/2006 | Prager et al. .................. 700/108 |
| 2007/0007981 A1 * | 1/2007 | Golan ........................... 324/765 |
| 2007/0239386 A1 | 10/2007 | Capps, Jr. et al. ............. 702/117 |
| 2008/0172189 A1 * | 7/2008 | Kadosh et al. .................. 702/58 |
| 2008/0262769 A1 * | 10/2008 | Kadosh et al. .................. 702/82 |

OTHER PUBLICATIONS

"Unit Level Predicted Yield: a Method of Identifying High Defect Density Die at Wafer Sort" Russell B. Miller, et al., IEEE 2001.
"Reliability Improvement and Burn in Optimization Through the Use of Die Level Predictive Modeling" Walter Carl Riordan, et al., International Reliability Physics Symposium, 2005.
Seminar entitled "Data Driven Statistical Testing from Test Response to Test Information" Professor Robert Daasch Portland State University Oct. 2006.

* cited by examiner

*Primary Examiner* — Drew A Dunn
*Assistant Examiner* — Mischita Henson
(74) *Attorney, Agent, or Firm* — Williams, Morgan & Amerson, P.C.

(57) ABSTRACT

A method includes receiving a first set of parameters associated with a subset of a plurality of die on a wafer. A die health metric is determined for at least a portion of the plurality of die based on the first set of parameters. The die health metric includes at least one process component associated with the fabrication of the die and at least one performance component associated with an electrical performance characteristic of the die. At least one of the die is tested. A protocol of the testing is determined based on the associated die health metric.

23 Claims, 3 Drawing Sheets

DETERMINING DIE TEST PROTOCOLS BASED ON PROCESS HEALTH

CROSS-REFERENCE TO RELATED APPLICATIONS

Not applicable.

BACKGROUND OF THE INVENTION

The present invention relates generally to manufacturing and testing of semiconductor devices, more particularly, to determining die test protocols based on process health.

There is a constant drive within the semiconductor industry to increase the quality, reliability and throughput of integrated circuit devices, e.g., microprocessors, memory devices, and the like. This drive is fueled by consumer demands for higher quality computers and electronic devices that operate more reliably. These demands have resulted in a continual improvement in the manufacture of semiconductor devices, e.g., transistors, as well as in the manufacture of integrated circuit devices incorporating such transistors. Additionally, reducing the defects in the manufacture of the components of a typical transistor also lowers the overall cost of integrated circuit devices incorporating such transistors.

Generally, a distinct sequence of processing steps is performed on a lot of wafers using a variety of processing tools, including photolithography steppers, etch tools, deposition tools, polishing tools, rapid thermal processing tools, implantation tools, etc., to produce final products that meet certain electrical performance requirements. In some cases, electrical measurements that determine the performance of the fabricated devices are not conducted until relatively late in the fabrication process, and sometimes not until the final test stage.

During the fabrication process various events may take place that affect the end performance of the devices being fabricated. That is, variations in the fabrication process steps result in device performance variations. Factors, such as feature critical dimensions, doping levels, contact resistance, particle contamination, etc., all may potentially affect the end performance of the device. Devices are typically ranked by a grade measurement, which effectively determines its market value. In general, the higher a device is graded, the more valuable the device.

The electrical tests performed after the fabrication of the device determine its final grade and functionality. A wide variety of tests may be performed. Exemplary tests include: final wafer electrical tests (FWET) that evaluate discrete test structures like transistors, capacitors, resistors, interconnects and relatively small and simple circuits, such as ring oscillators at various sites on a wafer; sort tests that sort die into bins (categories of good or bad) after testing functionality of each die; burn-in tests that test packaged die under temperature and/or voltage stress; automatic test equipment (ATE) tests that test die functionality using a test protocol that is a superset of sort; and system-level tests (SLT) that test packaged die in an actual motherboard by running system-level tests (e.g., booting the operating system).

The variety of electrical tests that devices must undergo consume considerable metrology resources, and may present a production bottleneck. Due to the complexity of integrated circuit devices, and the costs associated with screening devices to identify which are most at-risk, it is often difficult to identify the populations at risk for which increased metrology should be provided. Typically, fixed metrology sampling plans are employed for electrical testing. Such fixed sampling plans may, in some cases, result in reduced efficiency by implementing excessive testing, while in other cases, may result in the failure to adequately identify faulty devices.

This section of this document is intended to introduce various aspects of art that may be related to various aspects of the present invention described and/or claimed below. This section provides background information to facilitate a better understanding of the various aspects of the present invention. It should be understood that the statements in this section of this document are to be read in this light, and not as admissions of prior art. The present invention is directed to overcoming, or at least reducing the effects of, one or more of the problems set forth above.

BRIEF SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

One aspect of the present invention is seen in a method that includes receiving a first set of parameters associated with a subset of a plurality of die on a wafer. A die health metric is determined for at least a portion of the plurality of die based on the first set of parameters. The die health metric includes at least one process component associated with the fabrication of the die and at least one performance component associated with an electrical performance characteristic of the die. At least one of the die is tested. A protocol of the testing is determined based on the associated die health metric.

Another aspect of the present invention is seen in a system including a plurality of metrology tools, a die health unit, and a test unit. The metrology tools are operable to measure a first set of parameters associated with a subset of a plurality of die on a wafer. The die health unit is operable to determine a die health metric for at least a portion of the plurality of die based on the first set of parameters. The die health metric includes at least one process component associated with the fabrication of the die and at least one performance component associated with an electrical performance characteristic of the die. A test unit is operable to test at least one of the die, wherein a protocol of the testing is determined based on the associated die health metric.

BRIEF DESCRIPTION OF THE SEVERAL VIEWS OF THE DRAWINGS

The invention will hereafter be described with reference to the accompanying drawings, wherein like reference numerals denote like elements, and.

Figure 1:
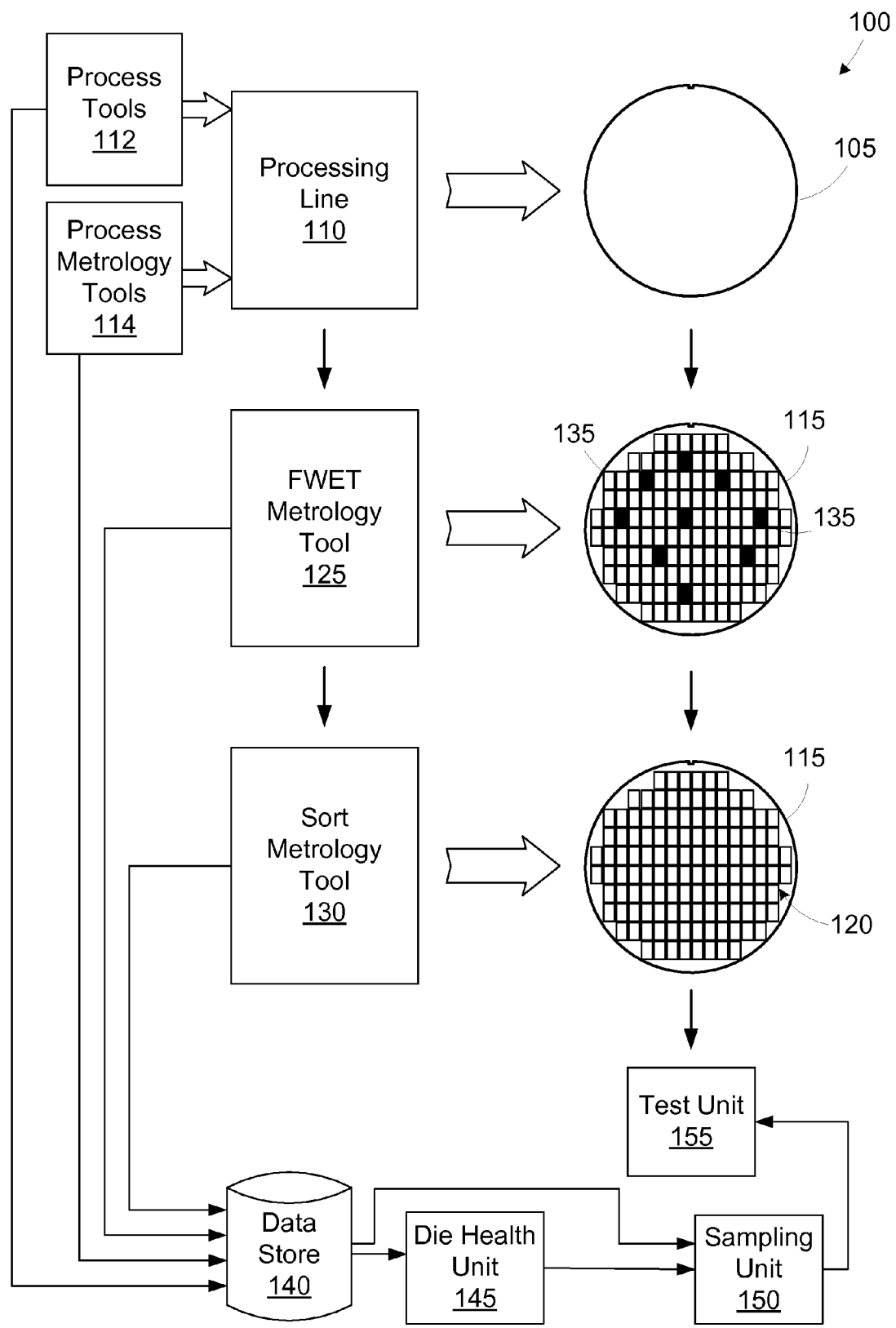
FIG. 1 is a simplified block diagram of a manufacturing system in accordance with one illustrative embodiment of the present invention.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

One or more specific embodiments of the present invention will be described below. It is specifically intended that the present invention not be limited to the embodiments and illustrations contained herein, but include modified forms of those embodiments including portions of the embodiments and combinations of elements of different embodiments as come within the scope of the following claims. It should be appreciated that in the development of any such actual implementation, as in any engineering or design project, numerous implementation-specific decisions must be made to achieve the developers' specific goals, such as compliance with system-related and business related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure. Nothing in this application is considered critical or essential to the present invention unless explicitly indicated as being "critical" or "essential."

The present invention will now be described with reference to the attached figures. Various structures, systems and devices are schematically depicted in the drawings for purposes of explanation only and so as to not obscure the present invention with details that are well known to those skilled in the art. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Portions of the present invention and corresponding detailed description are presented in terms of software, or algorithms and symbolic representations of operations on data bits within a computer memory. These descriptions and representations are the ones by which those of ordinary skill in the art effectively convey the substance of their work to others of ordinary skill in the art. An algorithm, as the term is used here, and as it is used generally, is conceived to be a self-consistent sequence of steps leading to a desired result. The steps are those requiring physical manipulations of physical quantities. Usually, though not necessarily, these quantities take the form of optical, electrical, or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise, or as is apparent from the discussion, terms such as "processing" or "computing" or "calculating" or "determining" or "accessing" or "displaying" or the like, refer to the action and processes of a computer system, or similar electronic computing device, that manipulates and transforms data represented as physical, electronic quantities within the computer system's registers and memories into other data similarly represented as physical quantities within the computer system memories or registers or other such information storage, transmission or display devices. Note also that the software implemented aspects of the invention are typically encoded on some form of program storage medium or implemented over some type of transmission medium. The program storage medium may be magnetic (e.g., a floppy disk or a hard drive) or optical (e.g., a compact disk read only memory, or "CD ROM"), and may be read only or random access. Similarly, the transmission medium may be twisted wire pairs, coaxial cable, optical fiber, or some other suitable transmission medium known to the art. The invention is not limited by these aspects of any given implementation.

Referring now to the drawings wherein like reference numbers correspond to similar components throughout the several views and, specifically, referring to FIG. 1, the present invention shall be described in the context of a manufacturing system 100. The manufacturing system 100 includes a processing line 110, one or more FWET metrology tools 125, one or more sort metrology tools 130, a data store 140, a die health unit 145, a sampling unit 150, and a test unit 155. In the illustrated embodiment, a wafer 105 is processed by the processing line 110 to fabricate a completed wafer 115 including at least partially completed integrated circuit devices, each commonly referred to as a die 120.

As described in greater detail below, a die health model is used by the die health unit 145 to generate a die health metric for each die based on the data collected during and after its fabrication. An exemplary list of parameters that may be considered by the die health model, including electrical and process parameters, is provided below in Table 1.

The processing line 110 may include a variety of process tools 112 and/or process metrology tools 114, which may be used to process and/or examine the wafer 105 to fabricate the semiconductor devices. For example, the process tools 112 may include photolithography steppers, etch tools, deposition tools, polishing tools, rapid thermal anneal tools, ion implantation tools, and the like. The process metrology tools 114 may include thickness measurement tools, scatterometers, ellipsometers, scanning electron microscopes, and the like. Metrology data collected by the process metrology tools 114 and/or data collected associated with the process tools 112 may be stored in the data store 140.

Particular techniques for processing the wafer 105 and collecting metrology data are well known to persons of ordinary skill in the art and therefore will not be discussed in detail herein for clarity and to avoid obscuring the present invention. Although a single wafer 105 is pictured in FIG. 1, it is to be understood that the wafer 105 is representative of a single wafer as well as a group of wafers, e.g. all or a portion of a wafer lot that may be processed in the processing line 110.

Any and all factory information including: ambient FAB conditions, tool state, consumable (materials) conditions, metrology and defect data collected regarding the processing of the wafers may be indicative of the health of the individual devices after such fabrication is completed. For example, if the process path for a particular wafer or lot is free of tool alarms or out of specification conditions, the relative health of the devices on the wafer may be higher. Other process parameters collected may indicate the type or number of defects, the purity of the layers formed, the critical dimensions of features formed, etc. These process parameters may also factor into the health of the resulting devices. An exemplary list of process parameters collected during the fabrication of the wafers is provided in Table 1 below.

After the wafer 105 has been processed in the processing line 110 to fabricate the completed wafer 115, the wafer 115 is provided to the FWET metrology tool 125. The FWET metrology tool 125 gathers detailed electrical performance measurements for the completed wafer 115. Final wafer electrical testing (FWET) entails parametric testing of discrete structures like transistors, capacitors, resistors, interconnects and relatively small and simple circuits, such as ring oscillators. It is intended to provide a quick indication as to whether or not the wafer is within basic manufacturing specification limits. Wafers that violate these limits are typically discarded so as to not waste subsequent time or resources on them.

For example, FWET testing may be performed at the sites 135 identified on the wafer 115. In one embodiment, FWET data may be collected at one or more center sites and a variety of radial sites around the wafer 115. Of course, the number and distribution of FWET sites may vary depending on the particular implementation. Exemplary FWET parameters include, but are not limited to, diode characteristics, drive current characteristics, gate oxide parameters, leakage current parameters, metal layer characteristics, resistor characteristics, via characteristics, etc. The particular FWET parameters selected may vary depending on the application and the nature of the device formed on the die. Table 1 below provides an exemplary, but not exhaustive, list of the types of FWET parameters collected (i.e., designated by "(F)" following the parameter description).

Following FWET metrology, the wafers 115 are provided to the sort metrology tool 130. At sort, individual dies are tested for functionality, which is a typically much longer and more involved test sequence than FWET, especially in the case of a microprocessor. The sort metrology tool 130 employs a series of probes to electrically contact pads on the completed die 120 to perform electrical and functional tests. For example, the sort metrology tool 130 may measure voltages and/or currents between various nodes and circuits that are formed on the wafer 115. Exemplary sort parameters measured include, but are not limited to, clock search parameters, diode characteristics, scan logic voltage, static IDD, VDD min, power supply open short characteristics, and ring oscillator frequency, etc. The particular sort parameters selected may vary depending on the application and the nature of the device formed on the die. Table 1 below provides an exemplary, but not exhaustive, list of the types of sort parameters collected (i.e., designated by "(S)" following the parameter description). Typically, wafer sort metrology is performed on each die 120 on the wafer 115 to determine functionality and baseline performance data. The results of the SORT and FWET testing may be stored in the data store 140 for further evaluation.

TABLE 1

| Block | Category | Type | Parameter |
|---|---|---|---|
| *Health Parameters* | | | |
| *ELECTRICAL PARAMETERS* | | | |
| PMIN | VDDmin | Scan Logic | Minimum Voltage (S) |
| | | BIST | Minimum Voltage (S) |
| LEAK | Gate Oxide | NOxide | Oxide Thickness (F) |
| | | POxide | Oxide Thickness (F) |
| | Leakage | NLeak | Leakage Current (F) |
| | | PLeak | Leakage Current (F) |
| | | SSID | Static IDD (S) |
| | | NJunction | N Junction Parameters (F) |
| | Drive | NDrive | Drive Current (F) |
| | | PDrive | Drive Current (F) |
| YIELD | Metal | Metal 1 | Various Resistance (F) |
| | | | Various Leakage (F) |
| | | . | |
| | | . | |
| | | . | |
| | | Metal n | Various Resistance (F) |
| | | | Various Leakage (F) |
| | Open Short | VDD Short | Resistance, Continuity, and Short Parameters (F, S) |
| | | VtShort | Resistance, Continuity, and Short Parameters (F, S) |
| | Via | Via 1 | Resistance (F) |
| | | . | |
| | | . | |
| | | . | |
| | | Via n | Resistance (F) |
| | Clock | Clock Search | Clock Edge Parameters (S) |
| | Bin Result | Test Classifier | Fail Type Indicator |
| SPEED | Resistor | NPoly | Resistance (F) |
| | | NRes | Resistance (F) |
| | RO | RO Freq | Ring Oscillator Frequency (S) |
| | | RO Pass/Fail | Pass/Fail (S) |
| | Miller | NMiller | Miller Capacitance (F) |
| | | PMiller | Miller Capacitance (F) |
| | Diode | Ideality | Thermal Diode Parameters (S) |
| | | Thermal Diode | Thermal Diode Measurements (S) |
| *PROCESS PARAMETERS* | | | |
| STI | Tool | Operations | Tool FDC Signals Tool Interrupts or Aborts |
| | | Materials | Chemical Conditions |
| | Metrology | SPC Alarms | Film Thickness Film Resistance |
| | | Photo Status | Overlay CD |
| | Defects | Defect Alarms | Total Defectivity Critical "XYZ" Defect Type |
| Gate | Tool | Operations | Tool FDC Signals Tool Interrupts or Aborts |
| | | Materials | Chemical Conditions |
| | Metrology | SPC Alarms | Film Thickness Film Resistance |
| | | Photo status | Overlay CD |
| | Defects | Defect Alarms | Total Defectivity Total Defective Die Critical "XYZ" Defect Type |

The process, SORT and FWET data are employed to generate health metrics for each of the die 120 on the wafer 115, as described in greater detail below. Health metrics may include performance components that relate to the performance of the device or yield components that relate to the ability of the device to function. Generally, the overall health metric may incorporate different combinations of non-yield, performance die health metrics and yield related die health metrics. For example, speed, minimum voltage, and leakage metrics are exemplary non-yield performance metrics. Process metrics may include both yield related and performance related parameters.

As described in greater detail below, a die health model, such as a principal components analysis (PCA) model, is used by the die health unit 145 to generate a die health metric for each die based on the collected process and sort data. In some cases, such as with process metrology data and FWET data, measurements are taken at a plurality of sites on a wafer rather than at every die location. In such cases, the data may be expanded to cover those untested die, as described below. Such expansion may take on a variety of forms. With process data, both wafers and sites are typically sampled. Hence, the data may require expansion across wafers as well as within wafers. For wafer-to-wafer expansion, various techniques such as interpolation or averaging (e.g., mean or median values) may be used. For within wafer expansion an interpolation, such as the splined interpolation described below, is an exemplary technique that may be used.

Figure 2:
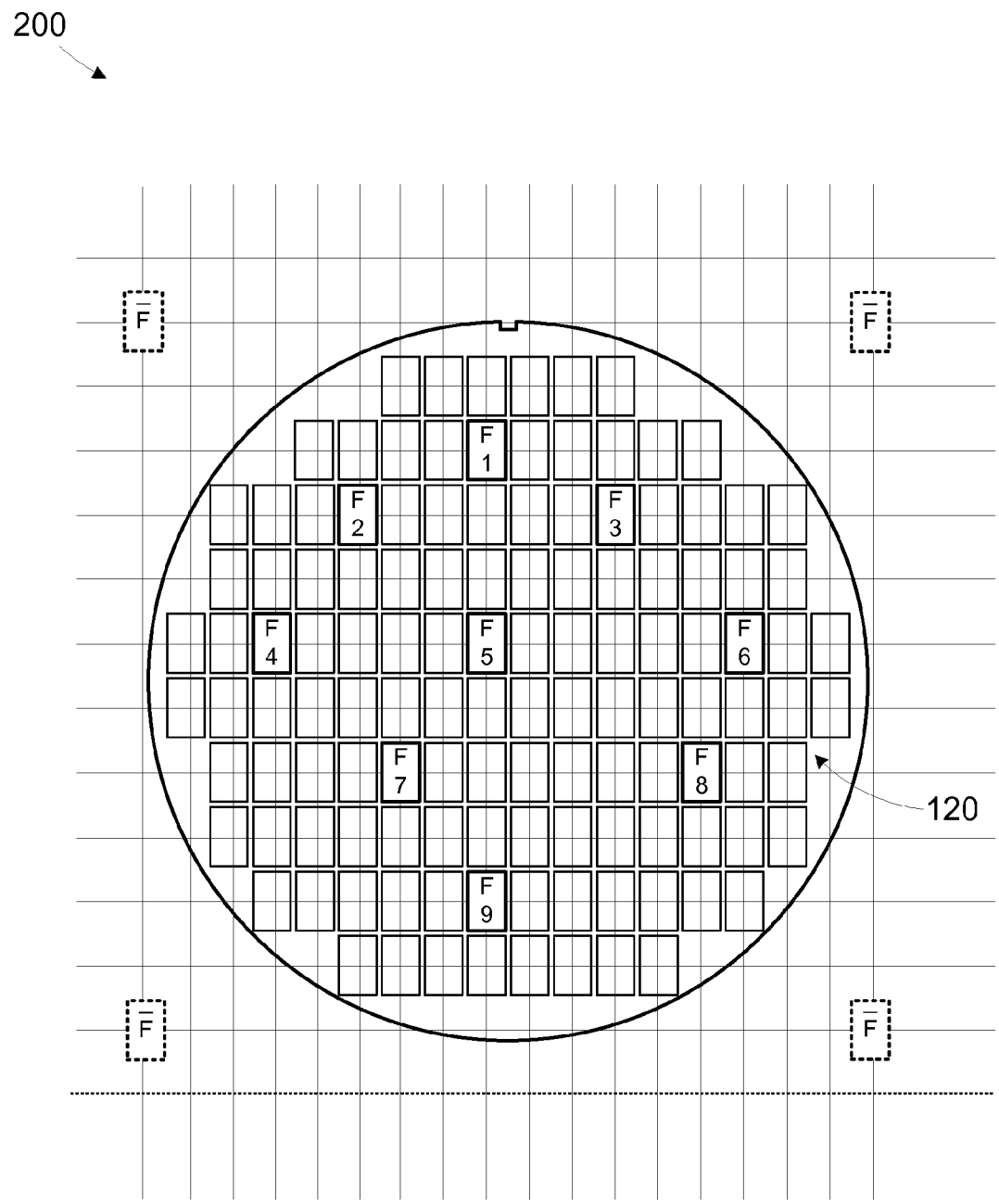
FIG. 2 is a diagram of a wafer map used for data expansion by the die health unit of FIG. 1.

For purposes of the following illustration, the expansion of data for FWET measurements is described. This technique may also be applied to the expansion of process metrology data that is not collected for every die location. Turning now to FIG. 2, a diagram illustrating a wafer map 200 used by the die health unit 145 to generate estimated FWET data for unmeasured die is shown. In the illustrated embodiment, a splined interpolation is used to estimate the FWET parameters for the untested die. A separate splined interpolation may be performed for each FWET parameter measured. Prior to the interpolation, the FWET data may be filtered using techniques as a box filter or sanity limits to reduce noise in the data.

The splined interpolation considers the actual measured FWET parameter values at the tested die locations, as represented by sites F1-F8 in FIG. 2. To facilitate the splined interpolation, derived data points, F, are placed at various points on the wafer map 200 outside the portion that includes the wafer. The F values represent the wafer mean value for the FWET parameter being interpolated. In the example wafer map 200 of FIG. 2, the wafer mean values, F, are placed at the diagonal corners of the wafer map 200. In other embodiment, different numbers or different placements of wafer mean values may be used on the wafer map 200. The output of the splined interpolation is a function that defines estimated FWET parameter values at different coordinates of the grid defining the wafer map 200. Other aggregate statistics, such as median values may also be used for the splined interpolation.

A splined interpolation differs from a best-fit interpolation in that the interpolation is constrained so that the curve passes through the observed data points. Hence, for the tested die, the value of the splined interpolation function at the position of the tested die matches the measured values for those die. Due to this correspondence, when employing the splined interpolation, the interpolation function may be used for both tested and untested die, thus simplifying further processing by eliminating the need to track which die were tested.

The particular mathematical steps necessary to perform a splined interpolation are known to those of ordinary skill in the art. For example, commercially available software, such as MATLAB®, offered by The MathWorks, Inc. of Natick, Mass. includes splined interpolation functionality.

Figure 3:
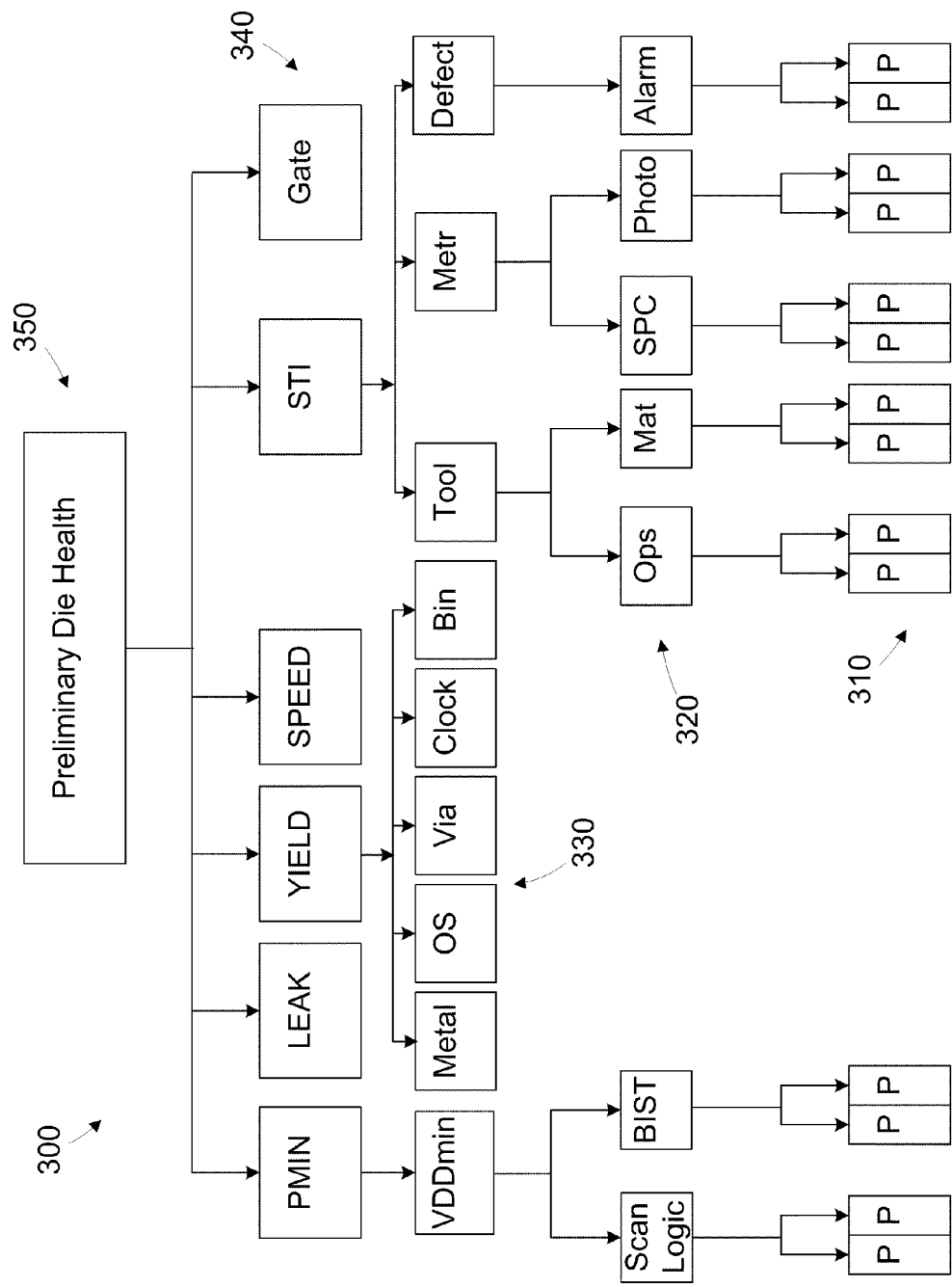
FIG. 3 is a diagram illustrating a hierarchy used by the die health unit of FIG. 1 for grouping parameters for determining die health.

Following the data expansion, the die health unit 145 generates a die health metric for each die 120. The parameters listed in Table 1 represent univariate inputs to a model that generates the die health metric. The block, category, and type and category groupings represent multivariate grouping of the parameters. FIG. 3 illustrates an exemplary hierarchy 300 for the model using the parameters and groupings illustrated in Table 1. Only a subset of the parameter types and categories are illustrated for ease of illustration. The hierarchy 300 includes a parameter level 310 representing each of the gathered process, sort, and FWET parameters. In the case of the FWET parameters and/or certain process parameters, the data expansion described above is used to generate estimated parameters for the untested die.

A first grouping of parameters 310 is employed to generate a type level 320, and multiple types may be grouped to define a category level 330. Multiple categories may be grouped to define a block level 340. The combination of the block level 340 groupings defines the die health metric 350 for the given die 120. In the illustrated embodiment, the PMIN block includes a VDDmin category level and scan logic and BIST type levels. The yield block includes metal, open short, via, clock, and bin result category levels. The STI block includes tool, metrology, and defect category levels. For ease of illustration, not all levels of the hierarchy 300 are illustrated in expanded detail in FIG. 3, as they are provided in Table 1. Again, the particular parameters 310, number of blocks 340, categories 330, and types 320 are intended to be illustrative and not to limit the present invention. In alternative embodiments, any desirable number of hierarchy layers may be chosen, and each layer may be grouped into any desirable number of groups.

In the illustrated embodiment, the values of the intermediate groupings may also represent health metrics themselves. For example, a health metric may be defined as one of the blocks 340 or the overall die health metric 350.

One type of model that may be used, as described in greater detail below, is a recursive principal components analysis (RPCA) model. Die health metrics are calculated by comparing data for all parameters from the current die to a model built from known-good die. For an RPCA technique, this metric is the $\phi_r$ statistic, which is calculated for every node in the hierarchy, and is a positive number that quantitatively measures how far the value of that node is within or outside 2.8-σ of the expected distribution. The nodes of the hierarchy include an overall for the die, multiblocks for parameter groups, and univariates for individual parameters. These $\phi_r$ values and all die-level results plus their residuals are stored in the data store 140 by the die health unit 145.

Although the application of the present invention is described as it may be implemented using a RPCA model, the scope is not so limited. Other types of multivariate statistics-based analysis techniques that consider a large number of parameters and generate a single quantitative metric (i.e., not just binary) indicating the "goodness" of the die may be used. For example, one alternative modeling technique includes a k-Nearest Neighbor (KNN) technique.

Principal component analysis (PCA), of which RPCA is a variant, is a multivariate technique that models the correlation structure in the data by reducing the dimensionality of the data. A data matrix, X, of n samples (rows) and m variables (columns) can be decomposed as follows:

$$X=\hat{X}+\tilde{X}, \quad (1)$$

where the columns of X are typically normalized to zero mean and unit variance. The matrices $\hat{X}$ and $\tilde{X}$ are the modeled and unmodeled residual components of the X matrix, respectively. The modeled and residual matrices can be written as $$\hat{X}=TP^T \text{ and } \tilde{X}=\tilde{T}\tilde{P}^T, \tag{2}$$

where $T \in \mathfrak{R}^{n \times l}$ and $P \in \mathfrak{R}^{m \times l}$ are the score and loading matrices, respectively, and l is the number of principal components retained in the model. It follows that $\tilde{T} \in \mathfrak{R}^{n \times (m-l)}$ and $\tilde{P} \in \mathfrak{R}^{m \times (m-l)}$ are the residual score and loading matrices, respectively.

The loading matrices, P and $\tilde{P}$, are determined from the eigenvectors of the correlation matrix, R, which can be approximated by $$R \approx \frac{1}{n-1}X^T X. \tag{3}$$

The first l eigenvectors of R (corresponding to the largest eigenvalues) are the loadings, P, and the eigenvectors corresponding to the remaining m-l eigenvalues are the residual loadings, $\tilde{P}$.

The number of principal components (PCs) retained in the model is an important factor with PCA. If too few PCs are retained, the model will not capture all of the information in the data, and a poor representation of the process will result. On the other hand, if too many PCs are chosen, then the model will be over parameterized and will include noise. The variance of reconstruction error (VRE) criterion for selecting the appropriate number of PCs is based on omitting parameters and using the model to reconstruct the missing data. The number of PCs which results in the best data reconstruction is considered the optimal number of PCs to be used in the model. Other, well-established methods for selecting the number of PCs include the average eigenvalues method, cross validation, etc.

A variant of PCA is recursive PCA (RPCA). To implement an RPCA algorithm it is necessary to first recursively calculate a correlation matrix. Given a new vector of unscaled measurements, $x_{k+1}^0$, the updating equation for the correlation matrix is given by $$R_{k+1}=\mu\Sigma_{k+1}^{-1}(\Sigma_k R_k \Sigma_k + \Delta b_{k+1}\Delta b_{k+1}^T)\Sigma_{k+1}^{-1}+(1-\mu)x_{k+1}x_{k+1}^T, \tag{4}$$

where $x_{k+1}$ is the scaled vector of measurements, b is a vector of means of the data, and $\Sigma$ is a diagonal matrix with the $i^{th}$ element being the standard deviation of the $i^{th}$ variable. The mean and variance are updated using $$b_{k+1}=\mu b_k+(1-\mu)x_{k+1}^0, \text{ and} \tag{5}$$

$$\sigma_{k+1}^2(i)=\mu(\sigma_k^2(i)+\Delta b_{k-1}^2(i))+(1-\mu)\times\|x_{k+1}^0(i)-b_{k+1}(i)\|^2. \tag{6}$$

The forgetting factor, $\mu$, is used to weight more recent data heavier than older data. A smaller $\mu$ discounts data more quickly.

After the correlation matrix has been recursively updated, calculating the loading matrices is performed in the same manner as ordinary PCA. It is also possible to employ computational shortcuts for recursively determining the eigenvalues of the correlation matrix, such as rank-one modification.

Die health prediction using PCA models is accomplished by considering two statistics, the squared prediction error (SPE) and the Hotelling's $T^2$ statistic. These statistics may be combined to generate a combined index, as discussed below. The SPE indicates the amount by which a process measurement deviates from the model with $$SPE=x^T(I-PP^T)x=x^T\Phi_{SPE}x, \tag{7}$$

where $$\Phi_{SPE}=I-PP^T. \tag{8}$$

Hotelling's $T^2$ statistic measures deviation of a parameter inside the process model using $$T^2=x^T P\Lambda^{-1}P^T x=x^T\Phi_{T^2}x, \tag{9}$$

where $$\Phi_{T^2}=P\Lambda^{-1}P^T, \tag{10}$$

and $\Lambda$ is a diagonal matrix containing the principal eigenvalues used in the PCA model. The notation using $\Phi_{SPE}$ and $\Phi_{T^2}$ is provided to simplify the multiblock calculations included in the next section. The process is considered normal if both of the following conditions are met:

$$SPE \leq \delta^2,$$

$$T^2 \leq \chi_l^2 \tag{11}$$

where $\delta^2$ and $\chi_l^2$ are the confidence limits for the SPE and $T^2$ statistics, respectively. It is assumed that x follows a normal distribution and $T^2$ follows a $\chi^2$ distribution with l degrees of freedom.

The SPE and $T^2$ statistics may be combined into the following single combined index for the purpose of determining the die health metric where $$\varphi = \frac{SPE(x)}{\delta^2} + \frac{T^2(x)}{\chi_l^2} = x^T\Phi x, \tag{12}$$

$$\Phi = \frac{P\Lambda^{-1}P^T}{\chi_l^2} + \frac{I-PP^T}{\delta^2}. \tag{13}$$

The confidence limits of the combined index are determined by assuming that $\phi$ follows a distribution proportional to the $\chi^2$ distribution. It follows that $\phi$ is considered normal if $$\phi \leq g\chi_\alpha^2(h), \tag{14}$$

where $\alpha$ is the confidence level. The coefficient, g, and the degrees of freedom, h, for the $\chi^2$ distribution are given by $$g = \frac{tr(R\Phi)^2}{tr(R\Phi)}, \text{ and} \tag{15}$$

$$h = \frac{[tr(R\Phi)]^2}{tr(R\Phi)^2}. \tag{16}$$

To provide an efficient and reliable method for grouping sets of variables together and identifying the die health, a multiblock analysis approach may be applied to the $T^2$ and SPE. The following discussion describes those methods and extends them to the combined index. Using an existing PCA model, a set of variables of interest $x_b$ can be grouped into a single block as follows:

$$x^T=[x_1^T \ldots x_b^T \ldots x_B^T]. \tag{17}$$

The variables in block b should have a distinct relationship among them that allows them to be grouped into a single category for die health purposes. The correlation matrix and $\Phi$ matrices are then partitioned in a similar fashion.

$$R = \begin{bmatrix} R_1 & & & \\ & \ddots & & \\ & & R_b & \\ & & & \ddots \\ & & & & R_B \end{bmatrix} \quad (18)$$

$$\Phi = \begin{bmatrix} \Phi_1 & & & \\ & \ddots & & \\ & & \Phi_b & \\ & & & \ddots \\ & & & & \Phi_B \end{bmatrix} \quad (19)$$

The contributions associated with block b for the SPE and $T^2$ and extended here to the combined index can be written as $$T_b^2 = x_b^T \Phi_{T_b^2} x_b \quad (20)$$

$$SPE_b = x_b^T \Phi_{SPE_b} x_b \quad (21)$$

$$\varphi_b = x_b^T \Phi_{\varphi_b} x_b. \quad (22)$$

The confidence limits for each of these quantities is calculated by modifying Equations 14, 15, and 16 to incorporate the multiblock quantities. While defined for the combined index, similar calculations hold for SPE and $T^2$.

$$g_{\varphi_b} = \frac{tr(R_b \Phi_{\varphi_b})^2}{tr(R_b \Phi_{\varphi_b})} \quad (23)$$

$$h_{\varphi_b} = \frac{[tr(R_b \Phi_{\varphi_b})]^2}{tr(R_b \Phi_{\varphi_b})^2} \quad (24)$$

$$\varphi_{b,lim} = g_{\varphi_b} \chi^2(h_{\varphi_b}) \quad (25)$$

The combined index used as the die health metric is defined by:

$$\varphi_r = \varphi_{b,r} = \log_{10}\left(\frac{\varphi_b}{\varphi_{b,lim}}\right) + 1. \quad (26)$$

The die health metrics computed for the die 120 may be used for various purposes. In one embodiment, the die health metric is employed by the sampling unit 150 to determine subsequent testing requirements in a test unit 155, such as burn-in, ATE, and system level test. For example, to decide which die undergo burn-in, the sampling unit 150 uses die health thresholds in combination with other known characteristics of the die 120, such as bin classification. For example, die 120 with health metrics above a predetermined threshold may skip burn-in testing altogether, while other threshold may be used to identify die 120 that should be subjected to a less strenuous burn-in (e.g., lower temperature or reduced time), and still other die 120 may be subjected to a full burn-in test or an extended burn-in test. With respect to ATE testing, die with high health metrics may proceed directly to system level testing. The level of ATE testing or system level testing may also be reduced based on the die health metrics. For example, a reduced scope ATE or system level test may be performed.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

We claim:

1. A method, comprising:
   receiving a first set of parameters associated with a subset of a plurality of die on a wafer;
   determining a die health metric for at least a portion of the plurality of die based on the first set of parameters, the die health metric including at least one process component generated using parameters associated with the fabrication of the die and at least one non-yield performance component generated using parameters associated with an electrical performance characteristic of the die; and
   performing electrical performance testing of at least one of the die after completion of the fabrication of the die, wherein a protocol of the testing is determined based on said die health metric to provide a first testing protocol for die having said die health metric greater than a predetermined threshold and a second testing protocol for die having said die health metric less than the predetermined threshold, wherein the first testing protocol has a reduced scope as compared to the second testing protocol.

2. The method of claim 1, further comprising:
   expanding the first set of parameters to generate an estimated value for at least one parameter in the first set of parameters; and
   determining the die health metric based on the expanded first set of parameters.

3. The method of claim 2, wherein expanding said first set of parameters further comprises expanding said first set of parameters using a splined interpolation.

4. The method of claim 3, further comprising:
   determining a wafer aggregate value for a selected parameter in the first set of parameters;
   defining a wafer map including the wafer, the wafer map including measured values for the selected parameter located in positions corresponding to measured die;
   placing the wafer aggregate value at least one predetermined position on the wafer map outside a portion of the wafer map including the wafer; and
   performing the splined interpolation using the measured values and the wafer aggregate value at the positions defined by the wafer map.

5. The method of claim 1, wherein the second testing protocol specifies burn-in testing requirements.

6. The method of claim 5, wherein the first testing protocol specifies reduced burn-in testing requirements.

7. The method of claim 1, wherein the testing protocol specifies system level testing requirements.

8. The method of claim 1, further comprising determining the die health metric using a multivariate statistical model incorporating the first set of parameters.

9. The method of claim 1, wherein the first set of parameters includes sort data and the die performance component incorporates said sort data.

10. The method of claim 1, wherein the first set of parameters includes final wafer electrical test data and the die performance component incorporates the final wafer electrical test data.

11. The method of claim 1, wherein the die health metric incorporates at least one yield component.

12. The method of claim 1, wherein the process component incorporates at least one yield parameter.

13. A system, comprising:
- a plurality of metrology tools operable to measure a first set of parameters associated with a subset of a plurality of die on a wafer;
- a die health unit implemented by a computing device operable to determine a die health metric for at least a portion of the plurality of die based on the first set of parameters, the die health metric including at least one process component generated using parameters associated with the fabrication of the die and at least one non-yield performance component generated using parameters associated with an electrical performance characteristic of the die; and
- a test unit operable perform an electrical performance test on test at least one of the die after completion of the fabrication of the die, wherein a protocol of the testing is determined based on said die health metric to provide a first testing protocol for die having said die health metric greater than a predetermined threshold and a second testing protocol for die having said die health metric less than the predetermined threshold, wherein the first testing protocol has a reduced scope as compared to the second testing protocol.

14. The system of claim 13, further comprising:
- expanding the first set of parameters to generate an estimated value for at least one parameter in the first set of parameters; and
- determining the die health metric based on the expanded first set of parameters.

15. The system of claim 14, wherein expanding said first set of parameters further comprises expanding said first set of parameters using a splined interpolation.

16. The system of claim 13, wherein the first and second testing protocols specify burn-in testing requirements.

17. The system of claim 13, wherein the first and second testing protocols specify system level testing requirements.

18. The system of claim 13, further comprising determining the die health metric using a multivariate statistical model incorporating the first set of parameters.

19. The system of claim 13, wherein the first set of parameters includes sort data and the die performance component incorporates said sort data.

20. The system of claim 13, wherein the first set of parameters includes final wafer electrical test data and the die performance component incorporates the final wafer electrical test data.

21. The system of claim 13, wherein the die health metric incorporates at least one yield component.

22. The system of claim 13, wherein the process component incorporates at least one yield parameter.

23. A system, comprising:
- means for receiving a first set of parameters associated with a subset of a plurality of die on a wafer;
- means for determining a die health metric for at least a portion of the plurality of die based on the first set of parameters, the die health metric including at least one process component generated using parameters associated with the fabrication of the die and at least one non-yield performance component generated using parameters associated with an electrical performance characteristic of the die; and
- means for performing electrical performance testing of at least one of the die after completion of the fabrication of the die, wherein a protocol of the testing is determined based on said die health metric to provide a first testing protocol for die having said die health metric greater than a predetermined threshold and a second testing protocol for die having said die health metric less than the predetermined threshold, wherein the first testing protocol has a reduced scope as compared to the second testing protocol.

* * * * *